United States Patent [19]

Preston

[11] Patent Number: 4,748,632
[45] Date of Patent: May 31, 1988

[54] METHOD AND APPARATUS FOR CONTROLLING LASERS

[75] Inventor: Keith R. Preston, Woodbridge, England

[73] Assignee: British Telecommunications plc, Great Britain

[21] Appl. No.: 548,480

[22] Filed: Nov. 3, 1983

[30] Foreign Application Priority Data

Nov. 5, 1982 [GB] United Kingdom ............... 8231608

[51] Int. Cl.⁴ .............................................. H01S 3/13
[52] U.S. Cl. ...................................... 372/32; 372/26; 372/97; 372/37; 372/99; 372/107; 372/38; 372/20
[58] Field of Search ............... 372/32, 26, 99, 50, 372/92, 38, 33, 97, 37, 107, 20

[56] References Cited

U.S. PATENT DOCUMENTS

| | | | |
|---|---|---|---|
| 3,517,328 | 1/1970 | Dryden | 378/32 |
| 3,711,786 | 1/1973 | Vautier et al. | 372/32 |
| 3,793,595 | 2/1974 | Russo et al. | 372/32 |
| 3,835,415 | 1/1974 | Rutz et al. | 378/19 |
| 4,046,462 | 9/1977 | Fletcher et al. | 350/608 |
| 4,237,427 | 6/1980 | Holland | 378/29 |
| 4,355,395 | 8/1982 | Salter et al. | 378/38 |
| 4,461,006 | 7/1984 | Salour et al. | 372/43 |
| 4,504,950 | 3/1985 | Auyeung | 372/20 |
| 4,516,242 | 5/1985 | Yokota | 372/29 |

FOREIGN PATENT DOCUMENTS 0150886 11/1981 Japan ............................ 372/92

OTHER PUBLICATIONS

Voumard et al., "Single-Mode Operation of Diode Lasers Coupled to Hemispherical Resonators", Opt. Comm., vol. 13, No. 2, Feb. 75, pp. 130-133.
Voumard et al., "Resonance Amplifier Model Describ. Diode Lasers Coupled to Short Ext. Resonators", Appl. Phys., 12, pp. 369-378, 1977.
Preston et al., "External Cavity Controlled Sing. Long. Mode Laser Trans. Module", Abst. Lett., vol. 17, No. 24, p. 231, Oct. 81.
Fleming et al., "Spectral Characteristics of External-Cavity Controlled Semiconductor Lasers", IEEE JQE, vol. 17, No. 1, Jan. 81, p. 44.
IEEE Journal of Quantum Electronics, vol. 9, No. 2, Feb. 1973, New York (US), A. P. Bogatov et al.: "Study of the Single-Mode Injection Laser", pp. 392-394.
Electronics Letters, vol. 17, No. 24, Nov. 26, 1981, London (GB), K. R. Preston et al: "External Cavity Controlled Single Longitudinal Mode Laser Transmitter Module", pp. 931-933.
Electronics Letters, vol. 18, No. 2, Jan. 21, 1982, London (GB), J. Jirmann et al.: "Optogalvanic Stabilisation of a $CO_2$ Laser with an Electrodynamic Tuning Element", pp. 69-71.
Journal of Physics E: Scientific Instruments, vol. 15, No. 1, Jan. 1982, Dorking (GB), H. J. Cummins et al.: "Cavity Length Stabilisation of a 10 mW cw 337 $\mu$m HCN laser", pp. 50-52.
Lang et al.: "External Optical Feedback Effects on Semiconductor Injection Laser Properties", IEE Journal of Quantum Electronics, vol. QE-16, No. 3, Mar. 1980, pp. 347-355.

Primary Examiner—Leon Scott, Jr.
Attorney, Agent, or Firm—Nixon & Vanderhye

[57] ABSTRACT

A method and apparatus for controlling an external cavity of a semiconductor laser to maintain its emission in a single longitudinal mode. The length of the external cavity is varied by an electromagnet acting on ferromagnetic material attached to a copper foil reflector. Total optical power output of the laser is monitored and single longitudinal mode operation is achieved by maximizing the power output. An active technique employs modulation of the reflector position about a mean value. The magnetic manipulation of the reflector may find application in other laser systems, e.g. gas lasers.

18 Claims, 6 Drawing Sheets

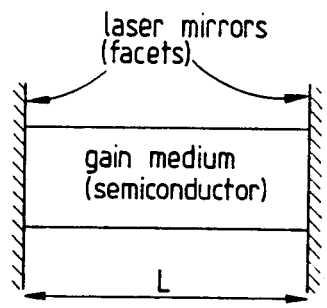
Fig.1(a) Semiconductor Laser Schematic
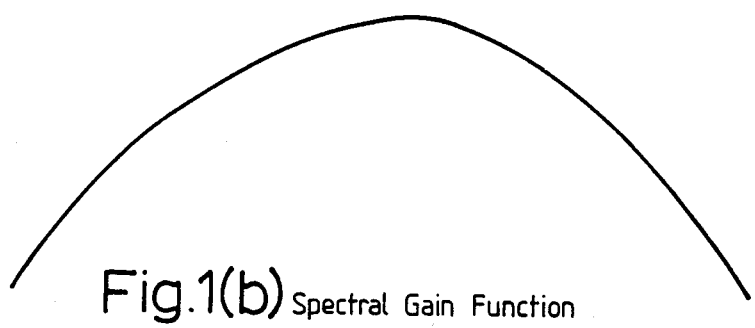
Fig.1(b) Spectral Gain Function
Fig.1(c) Longitudinal Modes
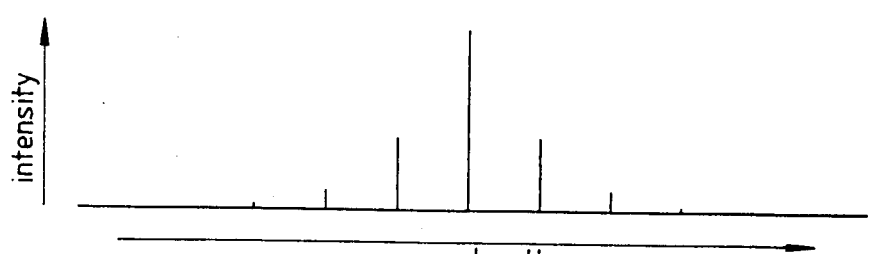
Fig.1(d) Resulting Spectrum

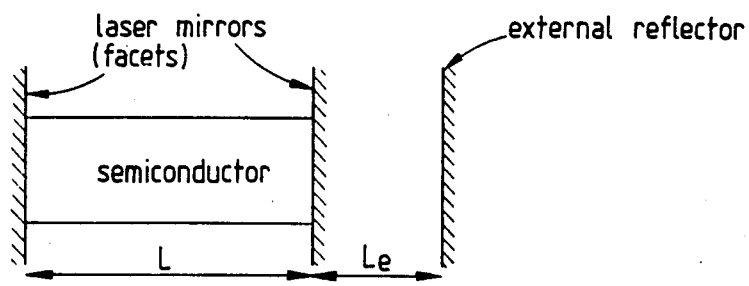
Fig. 2(a) Semiconductor Laser with External Cavity
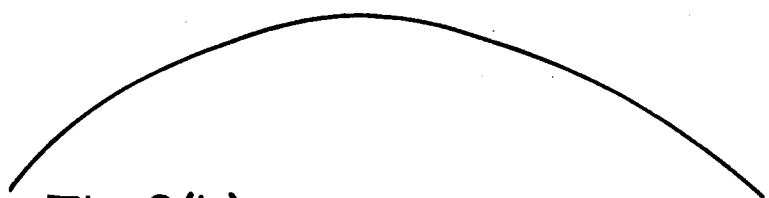
Fig. 2(b) Spectral Gain Function
Fig. 2(c) Longitudinal Modes of Laser
Fig. 2(d) External Cavity Selectivity Curve
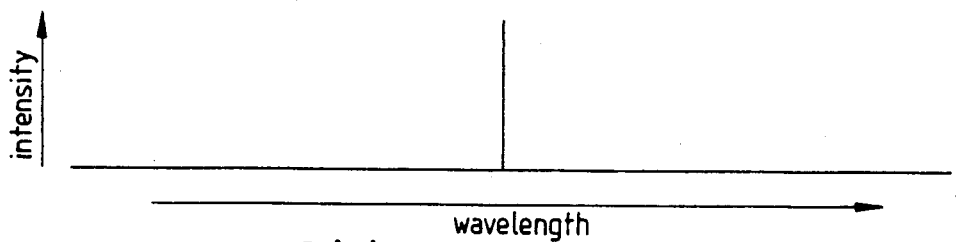
Fig. 2(e) Resulting Spectrum Effect of External Cavity Turning on Laser Spectrum

METHOD AND APPARATUS FOR CONTROLLING LASERS

DESCRIPTION

This invention relates to methods and apparatus for controlling lasers.

In a first aspect the invention applies exclusively to semiconductor lasers and will be explained with reference to FIGS. 1 to 3 which illustrate characteristics of semiconductor lasers. A simplified diagram of a semiconductor laser is shown in FIG. 1a. It consists of two mirrors with a semiconductor gain medium in between. The mirrors are formed by the cleaved facets of respective ends of the semiconductor chip. Two mechanisms combine to determine the wavelengths at which light is emitted. These are the spectral gain function or gain profile, and the longitudinal modes allowed by the dimensions of the laser cavity. The spectral gain function defines the range of wavelengths over which the semiconductor material can provide optical gain and is determined by the properties of the semiconductor material. It is a continuous curve as shown in FIG. 1b. The laser longitudinal modes are discrete wavelengths at which lasing can occur. The wavelengths of these modes are determined by the length of the laser cavity and by the effective refractive index of the semiconductor material. FIG. 1d shows an emission spectrum which could result from the spectral gain function and longitudinal mode positions shown. Essentially, lasing emission takes place only in those modes whose wavelengths are sufficiently close to the peak of the spectral gain function. This typically results in multi-longitudinal mode operation of the laser, though this is not always the case, for some lasers may operate in a single longitudinal mode even without an external cavity, provided that other conditions (temperature, current etc.) are favourable.

The addition of an external reflector provides a further wavelength selection mechanism. A schematic diagram of the semiconductor laser with an external reflector is shown in FIG. 2a. The effect of the external reflector may be considered as introducing an external cavity whose length $L_e$ is determined by the distance between the reflector and the nearest laser facet. This external cavity also has cavity modes, but due to the relatively low coupling efficiency between the semiconductor laser and the external cavity, the selectivity curve of the external cavity is much less sharp than that for the laser longitudinal modes (FIG. 2d). The positions of the external cavity modes are determined by the cavity length $L_e$. A change in $L_e$ causes the selectivity curve of the external cavity to move along the wavelength axis.

The effect of the additional wavelength selection mechanism introduced by the external cavity is to reduce the loss of laser longitudinal modes near its peak while increasing the loss of modes near its troughs. The effect of this on the laser spectrum depends upon the exact positions of the spectral gain function, the laser longitudinal modes and the external cavity modes. FIG. 3a shows the effect when the peaks of the three curves coincide. The central mode has its gain increased by the effect of the external cavity while its two nearest neighbours have their gains reduced. The result is that the spectral output from the laser consists of only the central mode. It may be noted that the external cavity also enhances certain other modes, but the reduction in the spectral gain function at these points means that these modes do not lase. FIG. 3b shows what happens when the tuning of the external cavity is changed, by altering the length $L_e$, such that a peak of the external cavity selectivity curve coincides with a different longitudinal mode of the laser. Once again this mode is enhanced while its neighbours are suppressed, and provided that the selectivity of the external cavity is adequate, the degree of enhancement overcomes the slight reduction in the spectral gain function at this point. The result once again is single longitudinal mode operation of the laser.

The external cavity tuning conditions discussed above have been described as resulting in single longitudinal mode operations, but this need not always be the case. FIG. 3c shows what happens if the peak of the external cavity selectivity curve falls between two laser longitudinal modes. The result is that the gain for the two modes is very similar and laser operation takes place in both modes as shown. Another possibility is shown in FIG. 3d, where the external cavity selectivity curve coincides with a laser longitudinal mode well away from the centre of the spectral gain function. The problem in this case is that a second laser mode at the other side of the spectral gain curve is also enhanced by the external cavity. This again results in two modes having similar gains, and lasing takes place at two separated longitudinal modes. These effects have all been observed experimentally.

The use of an external cavity semiconductor laser transmitter in a long-haul optical fibre transmission system is described by CAMERON, R. H., CHIDGEY, P. J. and PRESTON, K. R. in Electronics Letters, 1982, 18 (15), pp 650-651. The effects of chromatic dispersion in the fibre make it necessary to confine the laser emission to a single longitudinal mode, although the actual wavelength of the mode is unimportant. Thus the combination of functions shown in FIGS. 3(a) and (b) are acceptable in that one longitudinal mode results, whereas those shown in FIG. 3(c) and (d) are not. Both the spectral gain function and the wavelength of the longitudinal modes are affected by temperature and aging of the laser and to ensure single longitudinal mode operation it is not satisfactory to rely on initial or even occasional corrective adjustment of the external cavity.

The present invention in its first aspect is based on a discovery by the inventor that single longitudinal mode transmission in a semiconductor laser can be maintained by monitoring the total optical output power from the laser, and need not rely on sensing the wavelength of the emission by means of complex circitry.

Methods of controlling lasers by adjusting the length of the laser cavity by sensing the total optical power are known for controlling gas lasers. The purpose of such methods is to stabilise and maximise the power output of the laser. The cavity of a gas laser is usually relatively long and therefore susceptible to the effects of temperature, which changes the cavity length and hence the wavelength of the lasing mode. To compensate for the effects of temperature variation it is known to mount one of the laser mirrors on a piezoelectric support, by means of which the mirror may be moved through a small distance. It is to be emphasised that the wavelength of the longitudinal mode varies continuously as the mirror in the gas laser is moved. It is found that the output power from the gas laser is at a maximum when a cavity longitudinal mode is positioned at the peak of the spectral gain function. Thus the gas laser can be stabilised by moving the mirror to maximise the laser output.

It will be appreciated that the purpose of this method is not to restrict the gas laser to a single longitudinal mode, since it operates in a single mode regardless of the cavity length variations, rather its purpose is to stabilise the wavelength against ambient temperature variations by locking it to the spectral gain function of the lasing medium. In contrast the purpose of the method of the present invention, in its first aspect, is to produce a single longitudinal mode output regardless of the actual wavelength of this mode.

The application of the technique of cavity length adjustment to the gas laser seems reasonable a priori since it is to be expected that maximum power output will occur when a mode is at the centre of the spectral gain function, the position of maximum gain. However, the present invention, in its first aspect, is based on an appreciation of the non-obvious fact that single longitudinal mode operation of a semiconductor laser correlates with a maximisation of its output optical power. Thus surprisingly, it has been found that in the dual mode lasing situations described with reference to FIGS. 3(c) and (d) the total optical power is less than the single mode conditions, as in 3(a) and (b).

According to the present invention in a first aspect there is provided a method of controlling a semiconductor laser for single longitudinal mode operation, the laser having an external cavity defined by an external reflector, and the method comprising sensing the radiation output power of the laser and adjusting the optical path length of the external cavity to maximise the radiation output power.

The optical path length of the external cavity can be adjusted by moving the external reflector.

The present invention in a first aspect also provides a controlled semiconductor laser adapted to operate in a single longitudinal mode, comprising an external reflector mounted with respect to a facet of the laser to define an external cavity, means for adjusting the optical path length of the cavity, means operative to monitor the radiation output power of the laser and to produce a control signal representative of the magnitude thereof, and signal processing means fed with said control signal and arranged to control said adjusting means to vary the optical path length of said cavity such that the value of the radiation output power of the laser is maximised.

The reflector may be mounted for translational movement and the adjusting means may include means for accurately moving the reflector.

In an active embodiment of the invention, the means for accurately moving the external reflector is further controlled to cause the external reflector to undergo a small oscillatory motion about a mean distance from said laser facet, the signal processing means being operative to compare said control signal with respect to the oscillatory position of the reflector and to cause said means for moving the external reflector to adjust the mean position of the reflector to minimise the value of the rate of change in radiation output power with respect to reflector position.

The requirement that the movable laser mirror should be controlled to enable precise translational movement through very small distances exists both in the method according to the present invention in its first aspect and in the known systems for stabilising gas lasers. Methods suitable for producing such movement have previously been confined to the use of mechanical micro-manipulators or to a technique relying on the thermal expansion of a fine needle supporting the mirror, the heat being generated by passing an electric current through a small heater coil wound on the needle. If active maximisation of the optical power produced by the lasers is desired this will require the position of the mirror to be modulated about a mean position (described further below).

Mechanical fine manipulation suffers from the disadvantage that direct contact with the mirror support makes the mirror susceptible to slight movements or vibrations. This is also true of the electrical heating technique where the intimate association of the needle and coil causes the mirror to be affected by mechanical vibrations transmitted to the coil. Other disadvantages of the electrical heating technique include the possibility of contamination of the laser by outgassing of materials used in the coil, and the poor frequency response to an alternating current if an active maximisation technique is employed.

According to the invention in a second aspect there is provided a variable length cavity for a laser comprising an external reflector, defining the length of the cavity including or having in moving association therewith, magnetically responsible material, the position of the reflector with respect to a mirror of the laser being accurately controlled over a range of distances by an electromagnet producing a magnetic force on said magnetically-responsive material.

Embodiments of the present invention will now be described, by way of example only, with reference to the accompanying drawings. In the drawings:

FIGS. 1(a)–1(d) schematically depict a semiconductor laser, its spectral gain function, its possible longitudinal modes and the resulting semiconductor laser spectrum;

FIGS. 2(a)–2(e) are similar to FIGS. 1(a)–1(d) but also show the effect of including a coupled external cavity;

FIGS. 3(a)–3(d) illustrate the effect of external cavity tuning on the semiconductor laser spectrum;

Figure 3A:
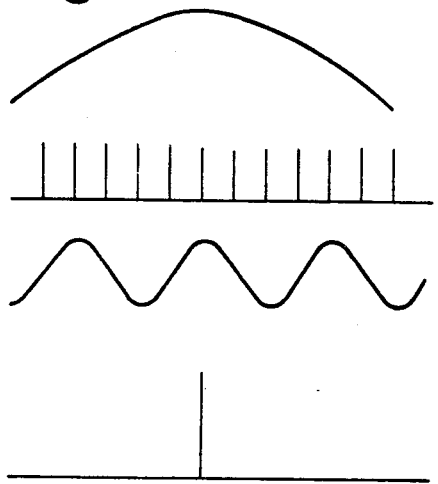
Figure 3B:
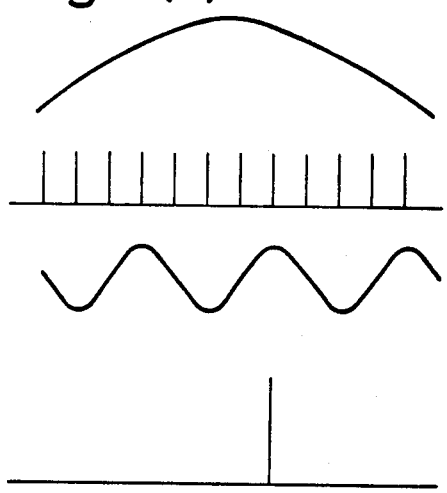
Figure 3C:
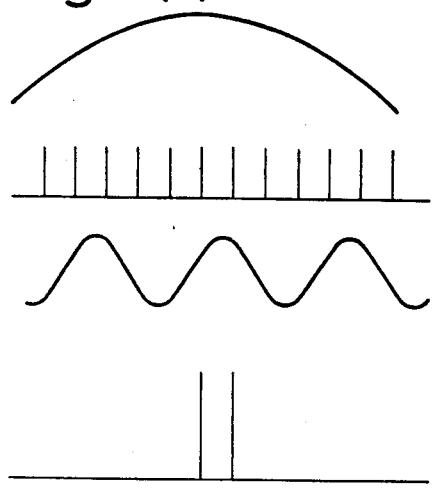
Figure 3D:
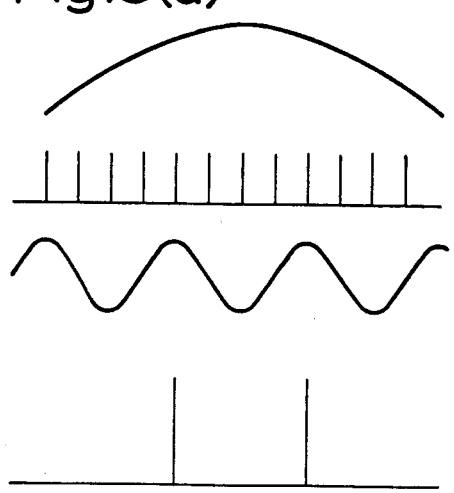
Figure 4:
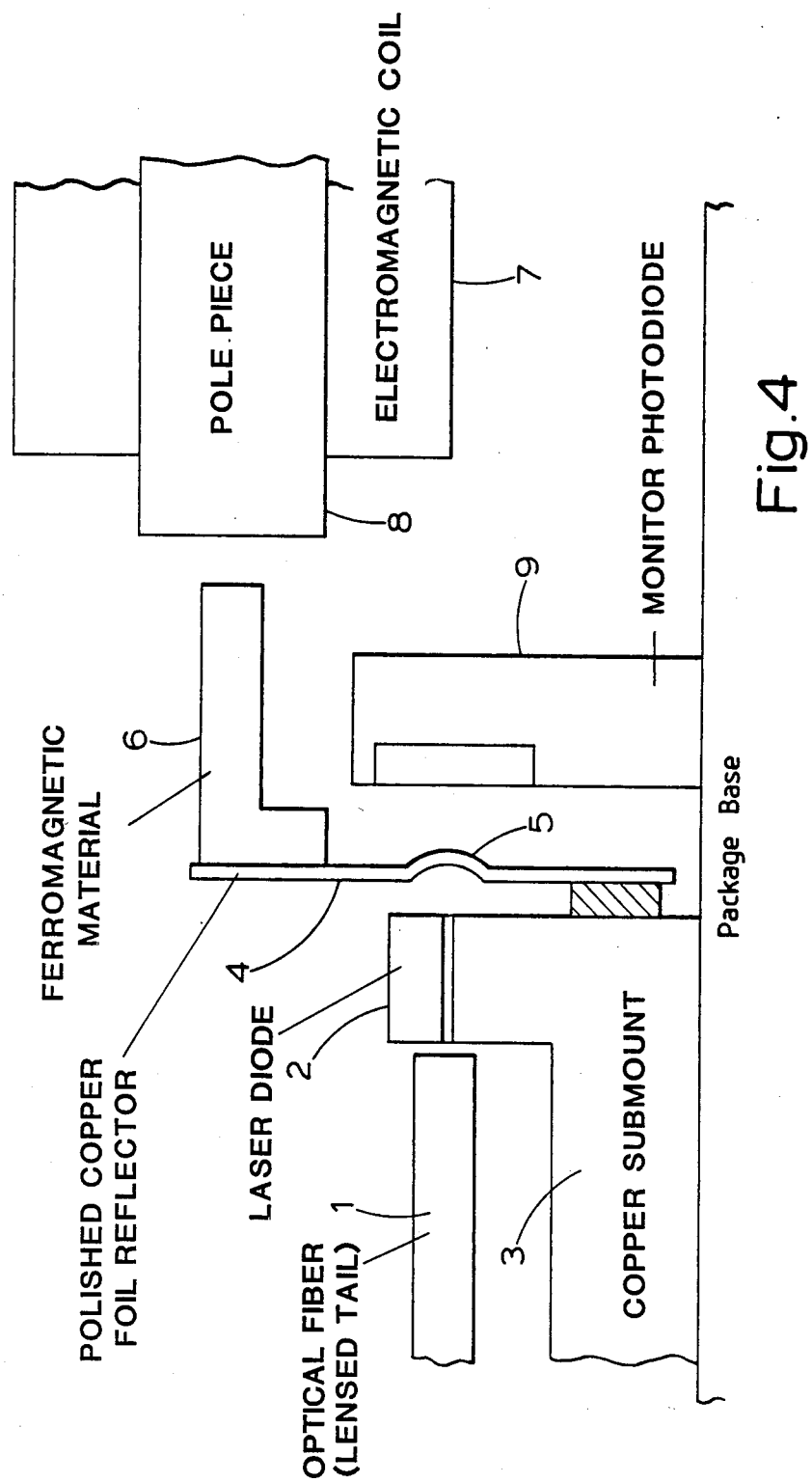
FIG. 4 is a schematic longitudinal section view of a controlled laser transmitter module.

Referring to FIG. 4, a laser transmitter module interfaces with a lensed tail of an optical fibre 1 which forms part of a long-haul, high-bit rate optics signalling system. The laser included in the module comprises an InGaAsP buried crescent laser diode 2, as described in Electron Lett, 1981, 17 (18), PP 651–653. The laser diode 2 has an operating wavelength of approximately 1.51 $\mu$m and has a threshold current of 34 mA at a heatsink temperature of 20° C. The optical fibre and the laser diode 2 are both mounted on a copper submount 3, the laser diode being mounted on a pedestal portion of the submount so that both its facets are accessible and so that its front facet is optically coupled to the end of the fibre tail.

A polished copper foil reflector 4 includes a spherically concave central portion 5. The reflector is mounted by bonding with epoxy resin, soldering or laser welding to secure a lower peripheral portion of the foil reflector to a facing surface of the submount 3, below the level of the laser diode. The copper foil extends perpendicularly to the path of the laser beam so that the concave reflecting portion 5 is spaced by a short distance behind the rear facet of the laser diode. The reflector thus defines an external cavity of the laser diode. The concave portion 5 of the reflector has one or more small holes to allow a small portion of the laser radiation to emerge for detection. The alignment and spacing of the reflector with respect to the rear facet of the laser is determined during manufacture of the module.

A shaped piece of ferromagnetic material 6 is attached to the upper margin of the rear face of the reflector 4. A small electromagnet 7 having a pole piece 8 is located to the rear of the piece of ferromagnetic material 6 and spaced therefrom by a small gap.

A monitor photodiode 9 is located behind the holes in the reflector 4 and so disposed that during laser emission the fraction of the radiation transmitted through the holes is incident on the diode surface.

Fine adjustment of the length of the external cavity of the laser diode is achieved by passing a current through the coil of the electromagnet 7. The resultant magnetic attraction of the piece of ferromagnetic material 6 to the pole piece 8 of the electromagnetic cause the copper foil to flex slightly and thereby alters the distance between the concave reflecting portion of the foil and the near laser facet. Typically movement of the reflector through a range of 1 micron is sufficient to tune the external cavity through its complete range, and this may correspond to a coil current of 10 mA at 2 v.

Figure 5:
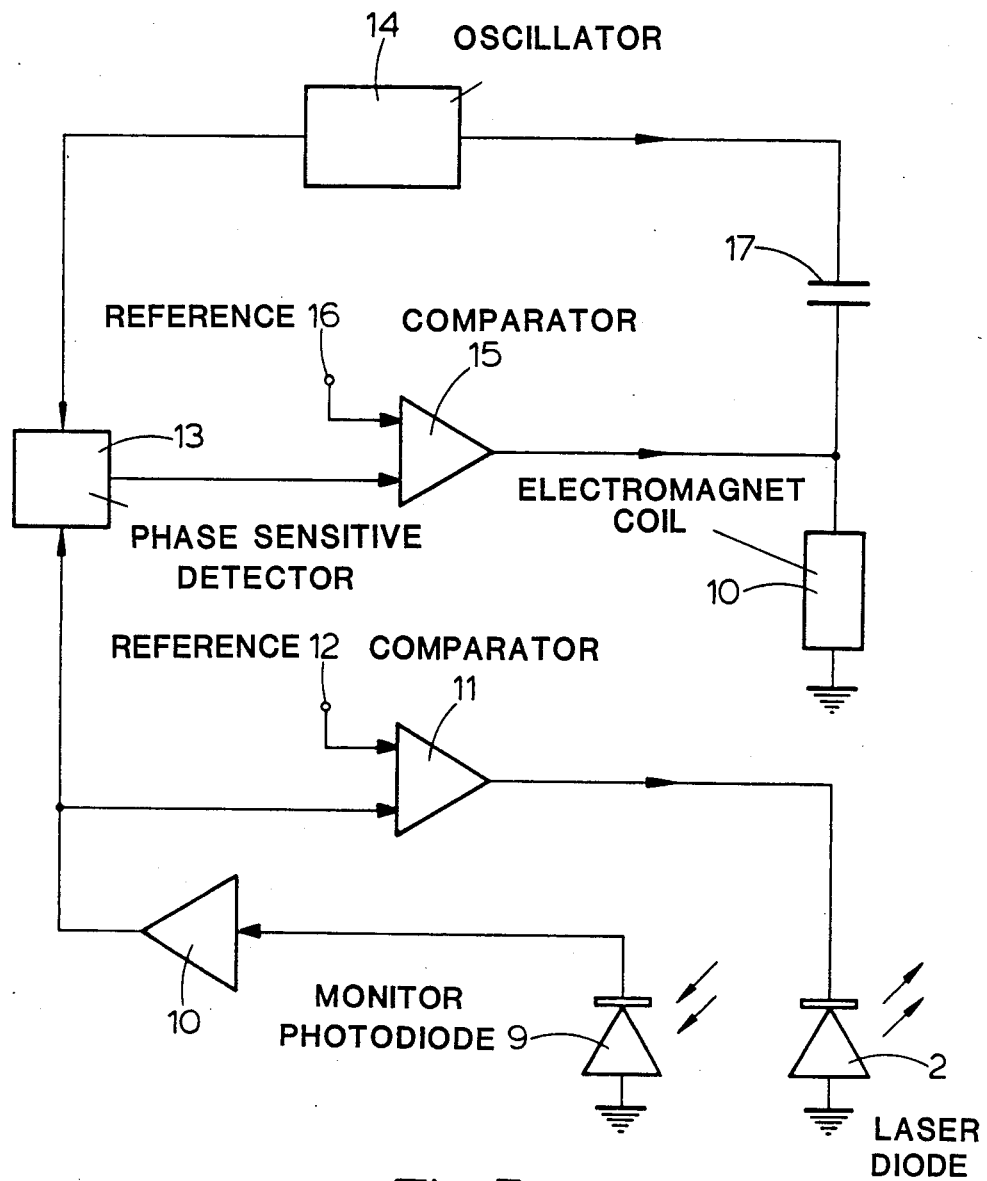
FIG. 5 is a block circuit diagram of a control circuit.

In this embodiment of the present invention restriction of the laser to single mode operation is carried out by active monitoring of the laser output. The control circuitry used in association with the transmitter module is shown in FIG. 5. The electrical coil 10 of the electromagnet, the laser diode 2 and the monitor photodiode 9 are connected to a single integrated circuit board housing the circuit components. The circuit includes a feedback loop including a connection from the cathode of the monitor photodiode 9 via, an operational amplifier 10 to one input terminal of a comparator 11. A second input terminal to the comparator 11 is connected to a reference signal source 12. This feedback loop is completed by a connection from the output terminal of the comparator 11 to the cathode of the laser diode.

A further feedback loop also uses the amplified signals from the monitor photodiode 9. The output terminal from the amplifier 10 is connected to one input terminal of a phase-sensitive detector 13, a second input terminal of which being connected to receive signals from an oscillator 14. The output of the phase-sensitive detector is connected to one input terminal of a comparator 15 having another input terminal connected to a reference signal source 16. The coil 10 of the electromagnet is connected for current supply from the comparator 15 and from the oscillator 14 via a capacitor 17. This further feedback loop thus relates the sensor power output of the laser with current through the coil 10 and hence with the position of the foil reflector 4.

The first feedback loop operates to stabilise the mean power of the laser output as follows. The photocurrent through the monitor photodiode 9 indicative of the optical power output of the laser 2 is amplified and compared at the comparator 11 with a reference value. The reference value is chosen at some suitable value and any deviation from this value results in a signal from the output of the comparator 11 to adjust the laser bias current. This feedback loop thus maintains the optical power output of the laser at a substantially constant value and is thus able to compensate for the effects of temperature and aging.

The second feedback loop embodies the present invention and includes a comparison at the phase sensitive detector 13 of the oscillator signal and the amplified mean photocurrent. The oscillator 14 produces a small amplitude signal at approximately 500 Hz. This signal, applied to the coil 10 of the electromagnet causes a small modulation in the length of the external cavity, and hence a variation in the laser output power. The value of the photocurrent from the monitor photodiode 9 reflects this variation. The phase detector 13 produces an output which is proportional to the first derivative of the laser power with respect to reflector position. This output has a polarity depending on the relative position of the external reflector compared with the position at which the power output is at a maximum. The output signal from this phase sensitive detector is amplified and fed to the coil 10 to adjust the mean current flowing through the coil. The loop thus acts to adjust the coil signal to maintain the laser power output at a maximum or minimum, and the polarity of the feedback signal is chosen so that it is tuned towards a point of maximum rather than minimum power output. Since the power maxima repeat with reflector position, corresponding to different laser longitudinal modes, the circuit can lock to any of those modes that the external cavity can select.

The loop gains and time constants of the two feedback circuits are carefully chosen so that they do not adversely affect one another.

EXAMPLE I

Figure 6:
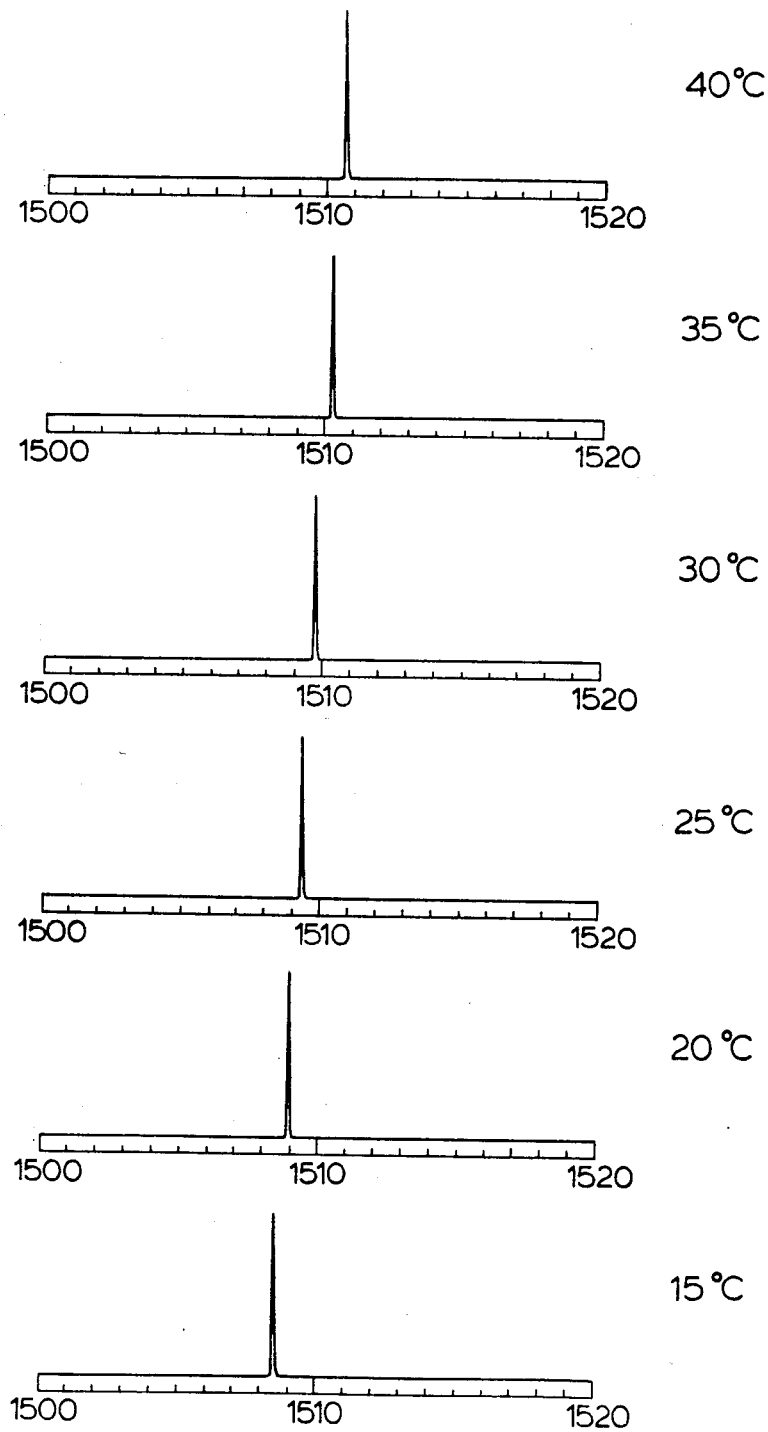
FIG. 6 illustrates the laser spectrum (normalised) at six different transmitter module temperature.

The control circuit was set up with the transmitter module at a temperature of 20° C. and an optical power output corresponding to a laser bias current of 50 mA. Single longitudinal mode operation was obtained and the output from the monomode fibre tail was monitored at a 1 m monochromator. The temperature of the transmitter module was then changed gradually from 15° C. to 40° C. Single longitudinal mode operation was maintained throughout this temperature range. FIG. 6 shows the normalised peak heights of spectra results at discrete temperatures through the range. It will be seen that the control circuit has successfully tracked one of the longitudinal modes of the laser, even though the wavelength of the mode has changed by about 2 nm with the temperature change of 25° C.

I claim:

1. A method of maintaining a semiconductor laser in single longitudinal mode operation, the laser having an external cavity defined by an external reflector, and the method comprising:
   sensing the radiation output power of the semiconductor laser,
   producing an electrical monitor signal representative of the magnitude of said sensed output power,
   processing said monitor signal to provide a control signal representing deviation of said output power from a maximum value, and
   utilizing said control signal to effect controlled adjustments of the optical path length of the external cavity to maintain the radiation output power of the semiconductor laser at a maximum.

2. A method of controlling a semiconductor laser as claimed in claim 1 wherein the optical path length of the external cavity is adjusted by moving said external reflector.

3. A controlled semiconductor laser capable of sustained single longitudinal mode operation, comprising:
- a semiconductor laser having a facet at each end thereof;
- an external reflector mounted with respect to a facet of the laser to define an external cavity,
- means for adjusting the optical path length of the cavity,
- means operative to monitor the radiation output power of the laser and to produce a control signal representative of the magnitude thereof, and
- signal processing means fed with said control signal and connected to control said adjusting means to vary the optical path length of said cavity to maintain the radiation output power of the laser at a maximum, thereby to sustain the laser in single mode operation.

4. A controlled semiconductor laser as claimed in claim 3 wherein the external reflector is movable to vary the optical path length of the cavity, and the adjusting means includes means for accurately moving said reflector.

5. A controlled semiconductor laser as claimed in claim 4 wherein:
- the means for accurately moving the external reflector is further controlled to cause the external reflector to undergo a small oscillatory motion about a mean distance from said laser facet,
- the signal processing means being operative to monitor said control signal, and rate of change thereof with respect to the oscillatory motion in reflector position, and to cause said means for moving the external reflector to adjust the mean distance of the reflector from the laser facet to minimise said rate of change.

6. A controlled semiconductor laser as claimed in claim 5 including further signal processing means also fed with said control signal and including a comparator means for comparing the control signal with a reference signal, and to produce an output signal according to the difference between them, the output signal from the comparator being used to control a laser bias applied to said semiconductor laser such that the control and reference signals are equalised, thereby to maintain the radiation output power of the laser at a predetermined value.

7. A controlled semiconductor laser as claimed in claim 4 wherein said external reflector includes material which is magnetically-responsive to an applied magnetic force and said means for accurately moving the reflector comprises an electromagnet producing a controlled magnetic field to move said reflector by exerting a controlled magnetic force on said magnetically-responsive material.

8. A controlled semiconductor laser as claimed in claim 7 wherein the external reflector includes a reflecting portion within a larger resilient mounting, the reflector being fixed at a position on its surface with respect to said laser facet, said magnetic force having a line of action displaced from said one position, so that, when applied, the reflector is caused to flex and move the reflecting portion with respect to the laser facet, thereby to vary the optical path length of said cavity.

9. A controlled semiconductor laser as claimed in claim 8 wherein the reflecting portion is concave.

10. A controlled semiconductor laser as claimed in claim 8 wherein the external reflector comprises metallic foil.

11. A variable length external cavity apparatus for use with a semiconductor laser having a facet at an end thereof, said cavity apparatus comprising:
- means for maintaining said semiconductor laser in a predetermined position;
- an external reflector disposed so as to be spaced from said facet of a mounted laser and thus defining the length of the external cavity
- an electromagnet; and
- magnetically-responsive material being connected to said external reflector, the position of the reflector with respect to said facet of the laser being accurately controllable over a range of distance by said electromagnet producing a magnetic force on said magnetically-responsive material.

12. A variable length external cavity apparatus for a semiconductor laser as claimed in claim 11 wherein the external reflector includes a reflecting portion within a larger resilient mounting, the reflector being fixed at one position on its surface with respect to the facet of a mounted laser, said magnetic force having a line of action displaced from said one position so that, when applied, the reflected is caused to flex and thereby move said reflecting portion translationally with respect to the facet of a mounted semiconductor laser.

13. A method for maintaining in a single longitudinal mode of operation a semiconductor laser having an optically coupled external cavity with an electrically controllable optical dimension, said method comprising the steps of:
- detecting the total optical output power of said semiconductor laser; and
- automatically controlling said optical dimensions with a feedback control loop to maintain said detected optical output power at a maximum value.

14. A semiconductor laser apparatus controlled to produce sustained semiconductor laser operation in a single longitudinal mode, said apparatus comprising:
- a semiconductor laser having a facet at an end thereof;
- an electrically controlled external cavity means having an optical reflector optically coupled to said facet and spaced from said facet by an optical distance that is determined by an input electrical control signal;
- a photoelectric transducer disposed to optically monitor the total optical power output of said laser and to produce an electrical power level signal representative thereof; and
- electrical control means connected to receive said power level signal from the transducer and to supply said control signal to the external cavity means so as to maintain maximum total optical power output from the semiconductor laser.

15. A semiconductor laser apparatus as in claim 14 wherein said electrical control means includes:
- an oscillator providing an oscillating electrical signal which is coupled to said external cavity means to continuously oscillate said optical dimension thereof and thus cause oscillations in said power level signal;
- a phase sensitive detector for comparing the phase of said oscillating electrical signal with the phase of corresponding oscillations produced in the power level signal and for producing an intermediate control signal representative of the phase difference detected therebetween; and a level comparator connected to compare said intermediate control signal with a predetermined reference level signal and to produce said control signal for controlling the external cavity means in response to the detected difference therebetween.

16. A semiconductor laser apparatus as in claim 15 wherein said semiconductor laser is biased to control the average power level output thereof and further comprising:

a second comparator connected to compare said power level signal with another predetermined reference level signal and to supply electrical current bias to said laser in response to the detected difference therebetween.

17. A semiconductor laser apparatus as in claim 16 wherein said external cavity means comprises;

a mount for said semiconductor laser;

a flexible reflector fixedly connected at a first end with respect to said mount and being free to flex and thus more a second opposite end thereof;

a ferromagnetic member fixedly attached to said second end of the reflector; and an electromagnet disposed to move said ferromagnetic member in response to electrical current being passed through a coil thereof.

18. A semiconductor laser apparatus as in claim 17 wherein said reflector has an apparatus therethrough and wherein said photoelectric transducer comprises a photodiode mounted to receive a sample of the laser optical output through said aperture.

* * * * *